United States Patent [19]

Chappell et al.

[11] 4,200,472
[45] Apr. 29, 1980

[54] SOLAR POWER SYSTEM AND HIGH EFFICIENCY PHOTOVOLTAIC CELLS USED THEREIN

[75] Inventors: Terry I. Chappell, Concord; Richard M. White, Berkeley, both of Calif.

[73] Assignee: The Regents of the University of California, Berkeley, Calif.

[21] Appl. No.: 912,724

[22] Filed: Jun. 5, 1978

[51] Int. Cl.² ............................................. H01L 31/06
[52] U.S. Cl. ........................ 136/89 PC; 136/89 MS; 136/89 CA; 357/30; 357/81; 357/82
[58] Field of Search .............. 136/89 PC, 89 P, 89 SJ, 136/89 H, 89 CA, 89 MS; 357/30, 81, 82

[56] References Cited

U.S. PATENT DOCUMENTS

| | | | |
|---|---|---|---|
| 3,585,714 | 6/1971 | Li | 29/580 |
| 3,902,794 | 9/1975 | Abrams | 350/294 |
| 3,977,071 | 8/1976 | Jarman | 29/580 |
| 3,977,904 | 8/1976 | Kohler | 136/89 |
| 3,988,166 | 10/1976 | Beam | 136/89 |
| 3,989,095 | 11/1976 | Voboril et al. | 165/1 |
| 3,994,012 | 11/1976 | Warner | 357/30 |
| 3,999,283 | 12/1976 | Dean et al. | 29/572 |
| 4,003,770 | 1/1977 | Janowiecki et al. | 148/174 |
| 4,084,985 | 4/1978 | Evans, Jr. | 136/89 P |
| 4,110,122 | 8/1978 | Kaplow et al. | 136/89 P |

OTHER PUBLICATIONS

J. A. Minucci et al. "Integral Glass Sheet Encapsulation For Terrestrial Panel Applications," *Conf. Record 12th Photo. Specialists' Conf.* (1976), pp. 309–312.

R. I. Frank, "Improved Performance of Solar Cells for High Intensity Applications," *Conf. Record, 12th Photo. Specialists' Conf.* (1976), pp. 820–825.

B. L. Sater et al., "The High Intensity Solar Cell-Key to Low Cost Photovoltaic Power," *Conf. Record, 12th Photo. Specialists' Conf.* (1976), pp. 365–368.

L. S. Napoli et al. "High Level Concentration of Sunlight On Silicon Solar Cells," *RCA Review*, vol. 38 (1977) pp. 76–108.

J. Muller "Ultrafast Multireflection & Transparent Thin Film Silicon Photocopies," *Tech. Digest, International Eletron Devices Meeting* (1976) pp. 420–423.

G. Wallis et al., "Field Assisted Glass-Metal Sealing," *J. Appl. Phys.*, vol. 40 (1969), pp. 3946–3949.

*Primary Examiner*—Aaron Weisstuch
*Attorney, Agent, or Firm*—Flehr, Hohbach, Test, Albritton & Herbert

[57] ABSTRACT

A solar power system including a movable platform for tracking the sun, a radiation concentrator, and a plurality of photovoltaic cell modules positioned on the platform for receiving concentrated solar radiation. The module includes a heat dissipation housing which supports a silicon cell across an open end of the housing. A heat transfer block physically engages the silicon cell and a metallic sponge and wick is attached to the heat transfer block and depends therefrom into the housing. The housing is partially filled with liquid to facilitate heat removal. The silicon cells are processed by preferential etching to form V grooves which define a plurality of diode elements having generally trapezoidal cross-sections. The elements may be serially interconnected by metallization on the V groove surfaces. The physical configurations of the elements and the use of antireflective coatings on surfaces of the elements result in high efficiency cells.

29 Claims, 12 Drawing Figures

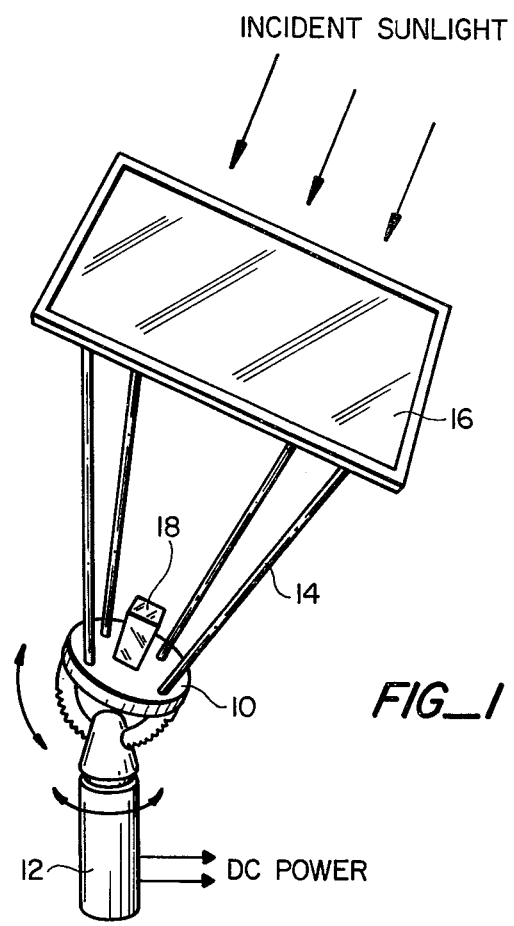
FIG_1
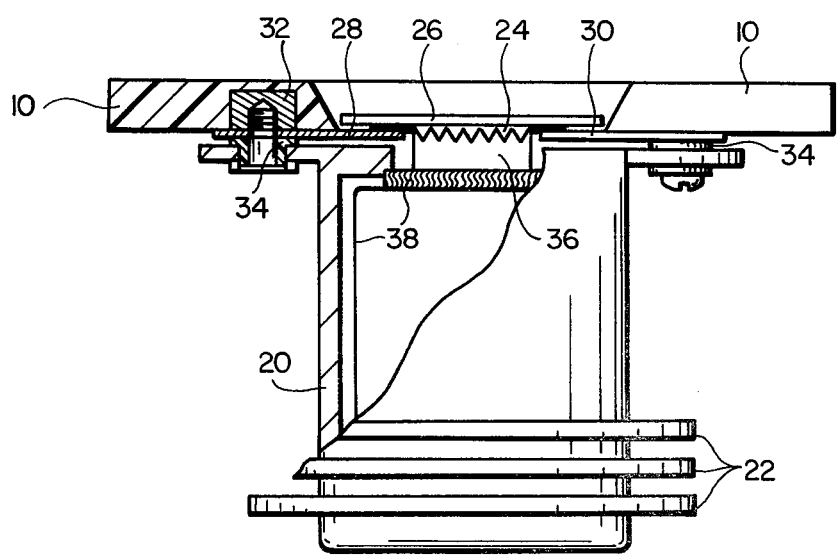
FIG_2

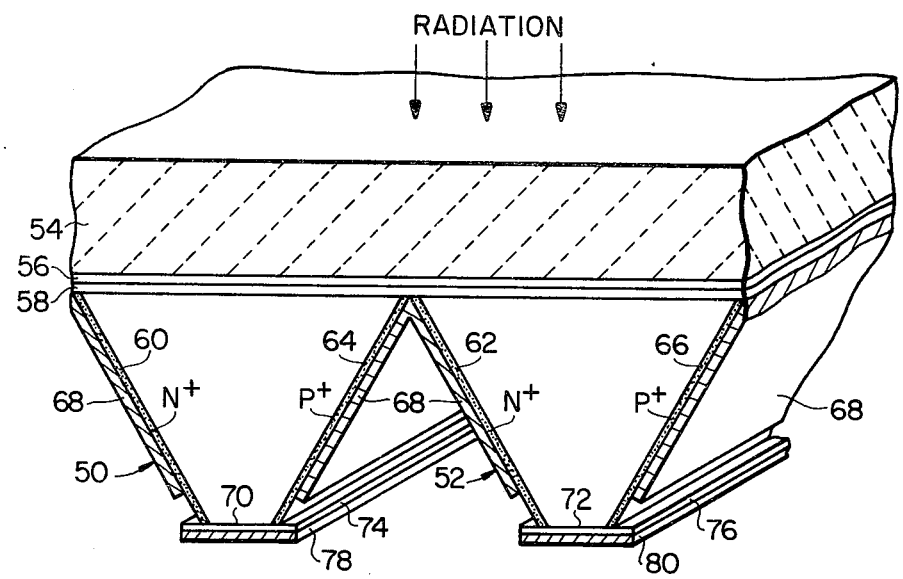
FIG_3
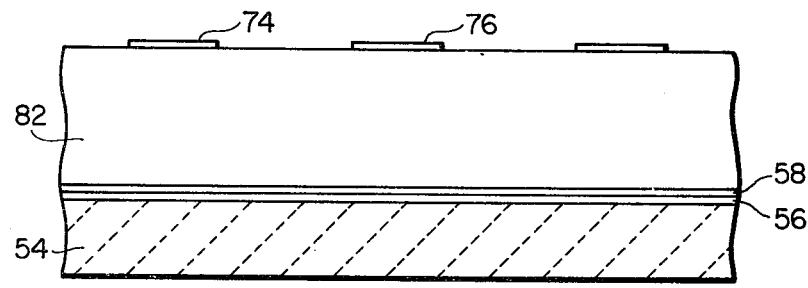
FIG_4
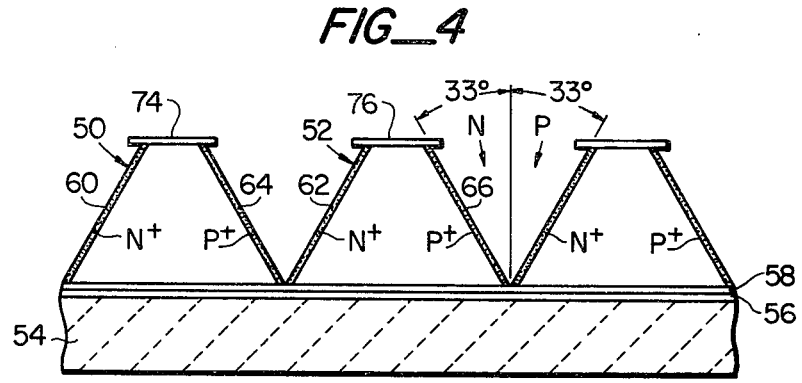
FIG_5
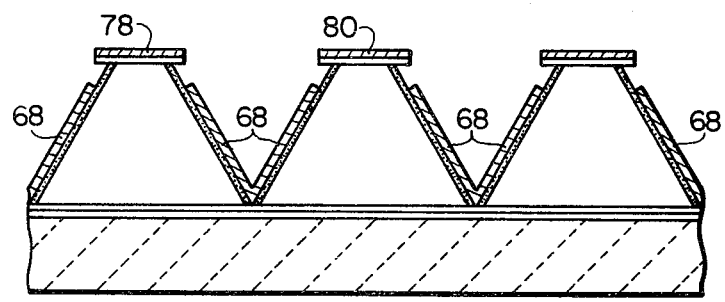
FIG_6

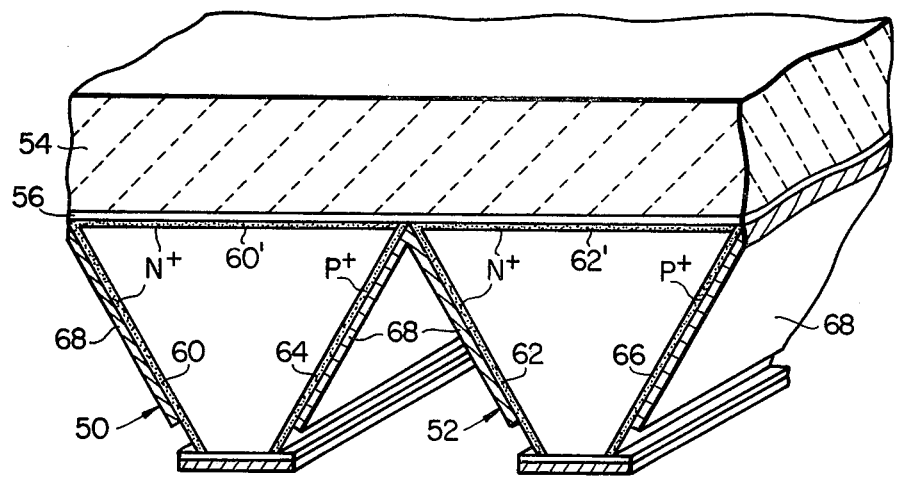
FIG_7
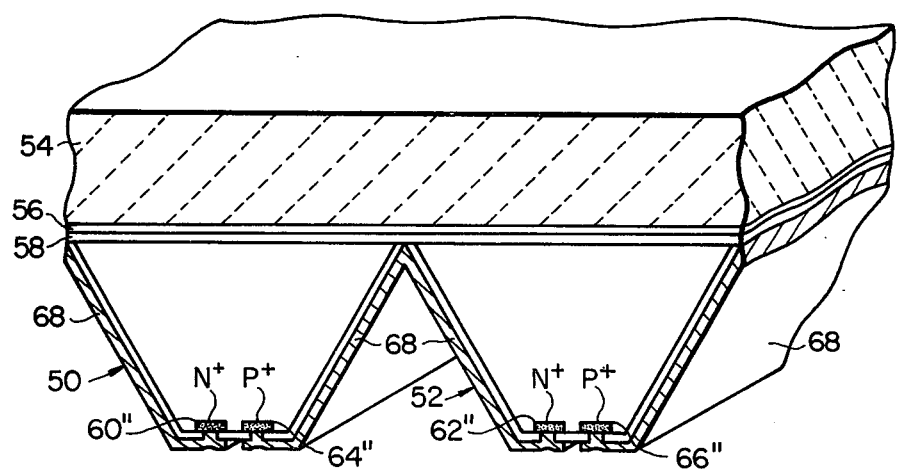
FIG_8
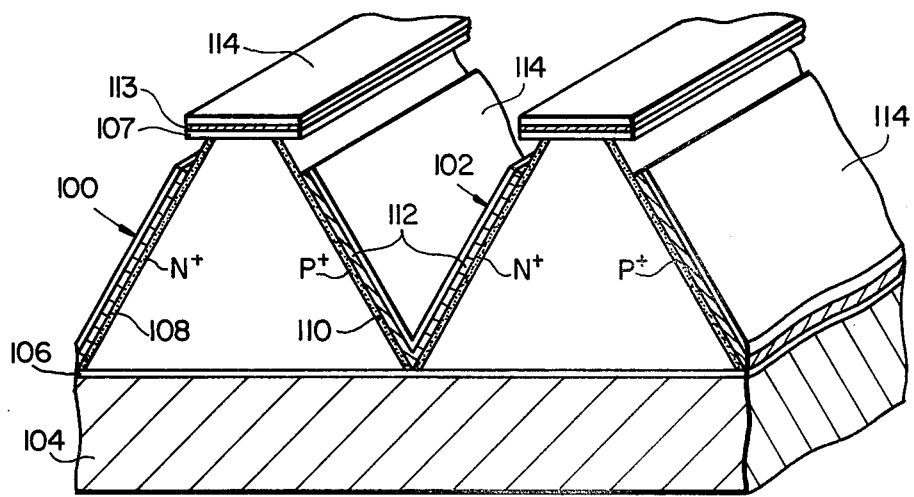
FIG_9

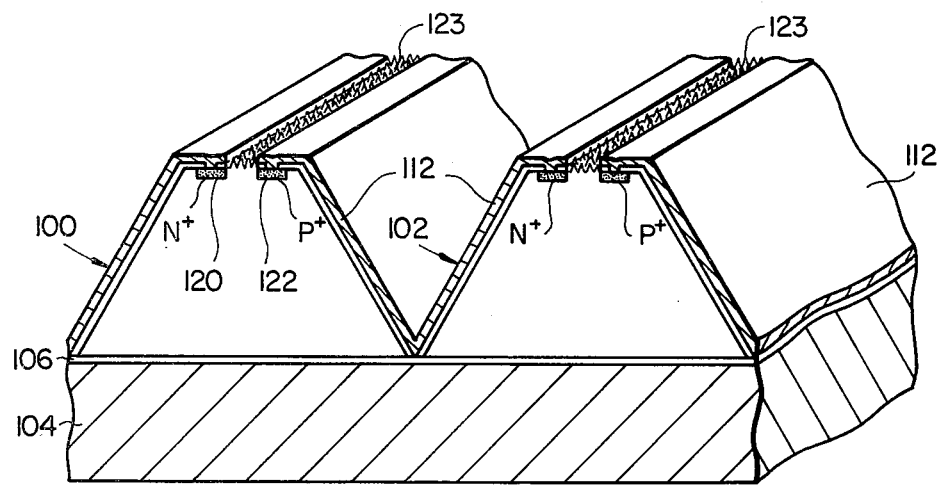
FIG_10
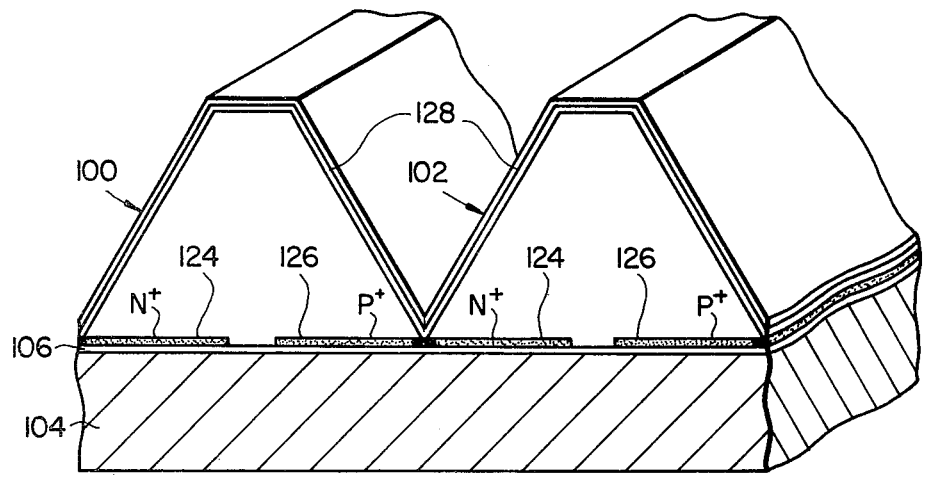
FIG_11
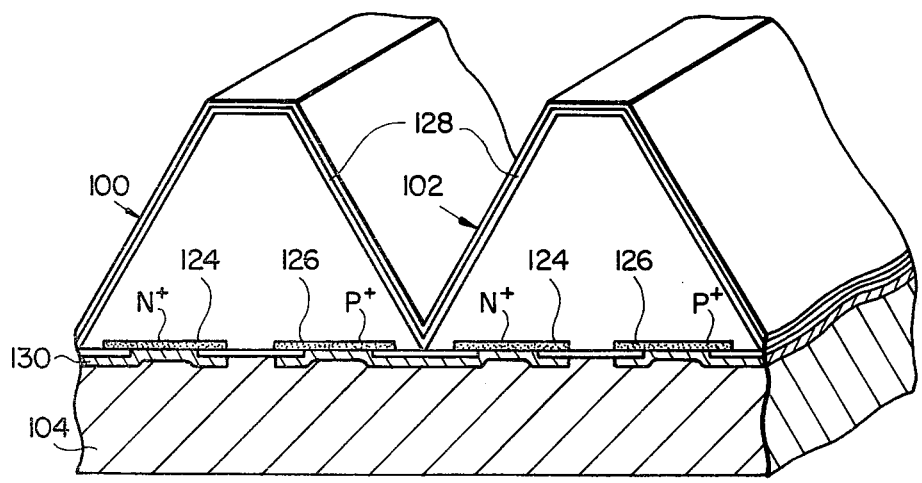
FIG_12

SOLAR POWER SYSTEM AND HIGH EFFICIENCY PHOTOVOLTAIC CELLS USED THEREIN

BACKGROUND OF THE INVENTION

1. Field of the Invention:

This invention relates generally to electric power systems, and more particularly the invention relates to power systems utilizing solar radiation to energize photovoltaic cells and to semiconductor PN junction devices used in photovoltaic cells.

2. Prior Art:

Solar radiation is recognized as a potential source for large amounts of energy, if properly harnessed. Historically, various heat transfer mechanisms have been devised for converting solar radiation into heat energy. In more recent years considerable effort has been directed to the conversion of solar energy to electrical energy through use of solar or photovoltaic cells. Such devices are employed in space applications, for example.

The photovoltaic cell comprises single crystalline silicon material in which a PN junction is formed by the selective introduction of elemental dopants into the semiconductor body. Doping techniques such as diffusion and ion implantation are well known in semiconductor processing technology.

In operation of the photovoltaic cell, a potential difference exists at the PN junction of the semiconductor cell due to the diffusion of electrical carriers, holes and electrons, across the PN junction which are then captured by majority carriers of the new region. By exposing the semiconductor cell to solar radiation, incident radiation is absorbed within the semiconductor body and will create electron-hole pairs or carriers which can be separated by the PN junction and made available to energize an external circuit. Only radiation or photons having an energy level of approximately 1.12 electron volts or higher can create an electron-hole pair in silicon. Such photons have a wavelength of 1.11 microns or shorter. Photons of greater wavelength having lesser energy may be absorbed by the cell as heat, and the excess energy of the shorter wavelength photons will be wasted as heat, also. Due to only a percentage of solar radiation (approximately 45% in silicon) being available for energy conversion and since the maximum power of a silicon photovoltaic cell is delivered at about one-half volt rather than 1.12 volts, maximum energy conversion without concentration of radiation is about 22%. However, in practice, other losses reduce this to about 10% in conventional photovoltaic cells.

The most widely employed of conventional photovoltaic cells is the planar junction device introduced by Chapin and Fuller at the Bell Telephone Laboratories in the mid-1950's. In such devices a PN junction is formed near a radiation receiving surface of a semiconductor body. Metallic electrode fingers are placed on the surface of the semiconductor body to form a current collection grid for the cell. Due to shadow loss from the collection grid on the radiation receiving surface and due to series resistance losses in the cells, the intrinsic efficiency of planar junction devices is substantially less than 20%.

The interdigitated back contact cell developed by Lammert and Schwartz of Purdue University eliminates the shadow loss by providing alternating P & N type regions on the back surface of a semiconductor body with the P regions connected in parallel and the N regions connected in parallel. The interdigitated contacts reduce series resistance losses, also. In this cell a silicon oxide layer is provided on the top surface to minimize the hole-electron recombination at the surface. Limitations of the cell include not only the more complex semiconductor processing in fabricating the device but also difficulty in optically matching the cell to the outside world.

Another prior art device is the vertical multi-junction cell proposed by Sater of NASA. This device is fabricated from a stack of semiconductor wafers having alternating N and P type conductivity and in which a thin aluminum layer is provided between wafers for adhesion purposes. The stack is then sliced to provide a cell with alternating P & N semiconductor regions, each separated by a thin aluminum layer. This device is characterized by a high surface recombination of holes and electrons because of the difficulty of surface passivation due to the presence of the aluminum material. Further, uniformity of the semiconductor regions is difficult to maintain due to the plurality of semiconductor wafers used in forming the stack.

Several embodiments of a monolithic photovoltaic semiconductor device are disclosed in U.S. Pat. No. 3,994,012 to Warner which utilize a plurality of series connected PN junctions in the monolithic body. One major limitation of the Warner devices is the involved and complex processing including several high temperature steps in fabricating the device. Additionally, the necessary electrical isolation between adjacent PN junction elements is difficult to achieve without the use of additional "bucking" or isolating PN junctions. Further, the Warner device utilizes a metal layer on the illuminated surface thereby creating a shadow loss in device operation.

SUMMARY OF THE INVENTION

An object of the present invention is an improved solar electric power system.

Another object of the invention is a solar electric power system which utilizes a photovoltaic cell module with improved heat dissipation characteristics.

Still another object of the invention is a photovoltaic cell with improved energy conversion efficiency.

Another object of the invention is a photovoltaic cell comprising semiconductor elements which are easily fabricated.

Yet another object of the invention is a simple process for fabricating a silicon cell.

Features of the invention include a photovoltaic cell which utilizes semiconductor elements each having a generally trapezoidal cross section.

Another feature of the invention is a semiconductor cell having a plurality of V grooved surfaces.

Another feature of the invention is a heat transfer mechanism in which a heat transfer block comprising semiconductor material is provided with a surface configuration which mates with the surface configuration of a photovoltaic cell for increased conduction of heat from the cell.

Briefly, the solar electric power system in accordance with the invention includes a support means with radiation concentrating means cooperatively mounted with the support means for receiving and concentrating solar radiation. A photovoltaic cell module is mounted on the support means to receive the concentrated solar radiation. The module includes a heat conductive housing having an open end, a semiconductor cell mounted across the open end between a transparent cover and a heat transfer block. A metallic sponge and wick means is attached to the heat transfer block and depends therefrom into the housing. The housing may be partially filled with a liquid to facilitate the heat transfer from the heat transfer block to the housing and thence to the outside ambient.

The photovoltaic cell comprises a plurality of single crystalline semiconductor elements each having a generally trapezodial cross section. The semiconductor elements are mounted to suitable support means for exposure to solar radiation from the concentrator. Because of the configuration of the semiconductor elements, each element can have smaller physical size than conventional planar junction devices while retaining efficient utilization of impinging photons. Further, the elements may be serially interconnected by low resistance means. Additionally, the elements are easily fabricated from a semiconductor wafer using conventional semiconductor processing techniques.

The invention and objects and features thereof will be more fully understood from the following detailed description and appended claims when taken with the drawings.

BRIEF DESCRIPTION OF THE DRAWINGS

FIG. 1 is a perspective view of one embodiment of a solar electric power system in accordance with the present invention.

FIG. 2 is a side view partially in section of a photovoltaic cell module in accordance with the present invention.

FIG. 3 is a perspective view in section of one embodiment of a photovoltaic cell in accordance with the present invention.

FIGS. 4–6 are side views in section illustrating the steps in fabricating the photovoltaic cell shown in FIG. 3.

FIGS. 7–12 are each perspective views in section of other embodiments of a photovoltaic cell in accordance with the present invention.

DESCRIPTION OF THE PREFERRED EMBODIMENT

FIG. 1 is a perspective view of a solar electric power system in accordance with the present invention. A support platform 10 is mounted on a support pedestal 12 which houses motor drive means which is coupled through suitable gear mechanisms to rotate the support platform vertically and horizontally as indicated, for solar tracking purposes. Mounted above platform 10 by suitable means such as support struts 14 is a radiation concentrator 16 such as a square acrylic Fresnel lens. It will be appreciated that other concentrator means may be employed such as, for example, mirror arrangements and dye concentrators. Mounted on platform 10 is photovoltaic cell module (not shown) above which may be positioned a secondary concentrator 18 such as a compound parabolic lens or cone concentrator. Additionally, a selective absorber can be included below the secondary concentrator to filter out the longer wavelength radiation which has insufficient energy to form electron-hole pairs in the photovoltaic cell. One such selective absorber is a thin layer (e.g. one centimeter deep) of water positioned between parallel glass plates. Such a filter can reduce approximately 20% of incoming radiation and thus prevent heating of the photovoltaic cell by radiation which has insufficient energy to create electron-hole pairs.

FIG. 2 is a side plan view partially in section of the photovoltaic cell module which is mounted to support platform 10 beneath the secondary concentrator 18 shown in FIG. 1. The module includes a heat conductive housing 20 made of suitable material such as aluminum. Housing 20 can be provided with a plurality fo fins 22 to facilitate the removal of heat by convection. The upper end of housing 20 is open and receives a solar cell 24 which is supportably mounted to a glass plate 26 and electrical leads 28 and 30. Electrical leads 28 and 30 provide for electrical conduction of electricity from the solar cell to an output bus bar 32.

As shown in the section view, lead 28 is fastened by screw means to bus bar 32 which is formed in an insulated portion of the support platform 10. Insulative gasket 34 provides electrical insulation between lead 28 and housing 20. A similar bus bar arrangement is provided for lead 30 (not shown).

In accordance with one feature of the invention, the solar cell 24 has a generally trapezoidal cross section which, as will be described further hereinbelow, may preferably be formed by etching grooves in a semiconductor body. A heat transfer block 36 abuts solar cell 24 to facilitate removal of heat from the cell. Advantageously, the heat transfer block may comprise a body of silicon material which has been processed in a manner similar to the surface of the semiconductor wafer from which solar cell 24 is fabricated whereby the cell and the heat transfer block have mating generally trapezoidal cross sectioned surfaces, as shown. Alternatively, as will be described hereinbelow, the heat transfer block may comprise other material which is affixed to the solar cell by suitable means such as epoxy for the removal for heat.

Solderably attached to the lower surface of heat transfer block 36 is a metallic sponge and wick 38 which forms a resilient support between the heat transfer block 36 and housing 20. The solder joint provides a durable bond and the sponge and wick permit good heat transfer through thermal cycling of materials which might have different coefficients of thermal expansion, such as silicon heat transfer block and the metallic housing. Suitable materials are available from Foametal Inc., Willoughby, Ohio, for example.

Housing 20 will be partially filled with a liquid such as water which flows by capillary action through wick 38 to the heat transfer block 36. The liquid then vaporizes from the heat from block 36, and the vapor condenses elsewhere within housing 20 thus providing for efficient transfer of heat to the housing walls. Heat is then removed from housing 20 through convection to the outside atmosphere, which is facilitated by means of fins 22.

Electrical contact is made to the photovoltaic cell module by means of the same two screws which fasten the cell module to the concentrator body. A pair of bus bars is present in the concentrator body; flexible leads from the cell are brought into contact with these two bars when the module is installed. Additionally, the cell can be sealed from the environment by a sealant applied around the region where the electrical leads 28 and 30 are soldered to the solar cell.

Since the efficiency of a photovoltaic cell decreases with increasing operating temperature and since the photovoltaic cell in accordance with the present invention is designed to operate with radiation concentration of $10^1$–$10^5$ times, effective heat dissipation is of paramount importance. The module design herein described is particularly efficient for heat removal and significantly contributes to the higher efficiency of the photovoltaic cell in accordance with the present invention.

Referring now to FIG. 3, one embodiment of a photovoltaic cell is partially illustrated in section in a perspective view. The full length of the cell is not shown, however the cell can be as long as the semiconductor wafer from which it is fabricated. Two elements 50 and 52 of a photovoltaic cell are shown. However, it will be appreciated that a cell will have many elements serially connected. Each element comprises a single crystalline semiconductor body with a generally trapezodial cross section. In this embodiment the bases of the elements are attached to a glass plate 54 through which solar radiation may be received by the elements. One glass which has good optical transparency and a closely matched coefficient of thermal expansion with silicon is 7070 glass from the Corning Glass Company. As will be further described, the glass provides a supporting substrate for the silicon cells and protects the elements from contamination. Between the glass plate 54 and the elements 50, 52 is a thin layer of an anti-reflective coating 56, tantalum oxide for example, which reduces optical reflection loss due to the differences in indices of refraction of the glass and silicon. Silicon oxide layer 58 may be thermally grown in the fabrication of the silicon elements and provides for low surface recombination of holes and electrons.

In one embodiment, the silicon element have a bulk dopant concentration of $10^{13}$–$10^{14}$ atoms per cubic centimeter and more heavily doped N+ and P+ regions are formed in opposing sides of the elements by introducing an N-type dopant such as phosphorous or arsenic into surface regions 60 and 62 and a P type dopant such as boron into surface regions 64 and 66. As will be described further below, the N+ regions and the P+ regions are advantageously formed by an ion implantation process. The bulk conductivity of the elements can be either P type or N type. Adjacent elements are serially connected by depositing a metal conductive layer 68 in the V groove between adjacent elements in contact with the P+ region 64 of element 50 and the N+ region 62 of element 52. Thus, a very low resistance interconnection can be provided for the solar cell.

The surface 70 and 72 of the elements, which are opposite the surfaces of elements 50 and 52 abutting glass plate 54, are provided with silicon oxide layers 74 and 76, respectively, to which metallic layers 78 and 80 are deposited. The metallic layers 78 and 80 provide for reflection of radiant energy back into the cell.

In the described cell, photons which have not been absorbed to produce an electron-hole pair, can be reflected internally from the metal-covered regions on the back of the cell and from the metallized junction regions. Over 90% reflection at wavelengths of 600 nm or longer can be obtained. Further, most photons reflected upward from the metal covered regions on the backside of the cell and from the metallized junction regions will be reflected back into the cell by the process of total internal reflection from the silicon surface adjacent to silicon oxide layer 58. Consequently, the effective optical thickness of the cell, and hence, its collection efficiency of solar photons can be greater than that of a conventional planar cell having a thickness equal to the height of the trapezoidal elements.

The enhanced photon absorption capability of the cell allows it to be made physically thin while retaining almost complete absorption of solar photons having greater than the bandgap energy of silicon (1.12 eV at 27° C.). Because of this and because silicon material is removed from the backside of the cell, the ratio of the illuminated area of the cell to its volume can be much larger than that in a conventional planar cell having an identical collection efficiency of solar photons. The larger ratio of the cell illuminated area to the cell volume produces a higher carrier concentration in the cell than in the planar cell. This gives the cell a higher open-circuit voltage and operating voltage than that of the planar cell.

In accordance with another aspect of the invention, the photovoltaic cell is readily fabricated using conventional semiconductor processing techniques whereby a single photoresist masking step is employed. FIGS. 4–6 are sided views in section of the silicon cell of FIG. 3 during fabrication and illustrate the simple fabrication process. Like elements of FIGS. 4–6 and FIG. 3 have the same reference numerals.

Initially, a P-type silicon wafer having a surface crystal orientation of 1-0-0 and a thickness of 50 microns and a resistivity of 13 ohm-centimeter is thermally oxidized in steam at a temperature of approximately 1000° C. to form silicon oxide layer 58 and a similar thermal oxide layer on the opposing surface of the silicon wafer. The oxide thickness is preferably about 0.5 micron. To obtain a low surface recombination of hole and electrons, a low surface-state density of the silicon oxide is required. The low surface state values can be obtained by following the thermal oxidation of the silicon wafer with a nitrogen annealing step. The silicon oxide layer on the surface of the silicon wafer opposing layer 58 is protected with photoresist and silicon oxide layer 58 is thinned to a thickness of about 250 angstroms by etching in dilute hydrofluoric acid.

Thereafter, the anti-reflective coating 56 is formed over the silicon oxide layer 58 by the reactive sputtering of tantalum which deposits as tantalum oxide on the surface. Alternatively, tantalum may be vapor deposited on the surface and subsequently oxidized to obtain tantalum oxide. Other known anti-reflective materials such as titanium oxide may be used, also. Preferably, the anti-reflective coating has an optical thickness of a quarter the wavelength of radiation in the anti-reflective coating at 5500 angstroms, or approximately 500 angstroms thickness.

The oxidized silicon wafer is attached to the glass plate 54 by means of a conventional field assisted bonding process (FAB). The silicon wafer 82 and glass plate 54 are stacked with the silicon oxide layer 58 and anti-reflection coating 56 therebetween, and the stacked structure is sandwiched between a polished silicon wafer and another glass plate with like materials touching each other. This composite structure is then placed between graphite blocks to which electrical connections are made, and the stack is then heated to 500° C. in a quartz vacuum furnace. With the negative polarity on the glass side, 1,000 volts DC is applied to the stack for approximately ten minutes. This procedure results in the glass plate bonding to the silicon wafer at the anti-reflective coating interface.

Next, the single photoresist masking step employed in the process is used to define the oxide strips 74 and 76. Standard photoresist masking and etch techniques are employed to define the strips. The dimensions of the silicon oxide strips and spacing thereof are important in the subsequent processing of the silicon wafer when forming V grooves which define the individual elements of the silicon cell. For a silicon wafer of 50 microns thickness, the strip width is 17.4 microns and strip spacing is 65 microns. A preferential etchant can be applied to a silicon wafer having 1-0-0 crystalline orientation which etches into the wafer at an angle of 54.7° from the surface of the wafer with the normal to the V grooved surfaces aligned parallel to the 1-1-1 crystalline axis of the silicon wafer. Thus, by appropriate dimensioning of the silicon oxide strips, which act as a mask against the preferential etchant, V grooves are etched through the silicon wafer to the underlying silicon oxide layer 58 to obtain a desired generally trapezoidal cross section for the silicon element. As noted in FIG. 5, the preferential etching process results in a slight undercut of the silicon beneath the oxide strips 74 and 76 which is advantageously utilized in the forming of the electrical conductive pattern as will be described further hereinbelow.

Referring to the dimensions illustrated in FIG. 6, the relationship of the strip width, W, to strip spacing, S, for a wafer height, H, is given as follows:

$$S = (2H/\tan \theta) + D - 2U$$

$$W = R + 2U$$

$$U = (3/50) H/\sin \theta$$

where
D is the spacing of elements at the silicon oxide interface at the illuminated surface
U is the undercut of silicon beneath one edge of each strip
$\theta$ is the angle of the etched surface
R is the width of the silicon beneath the oxide strip Preferential etchants and etching processes for silicon are well-known in the semiconductor art. In one embodiment a mixture of 120 milliliters of ethylenediamine, 22 grams of pyrocatechol, and 60 milliliters of water is used in a reflux condensor-fitted pyrex container to perform the V groove etching. The etchant temperature is maintained at 104°–110° C. during the approximately 50 minutes necessary to etch through a 60 micron thick silicon wafer. After etching, the glass plate and silicon elements are cleaned in hot methyl alcohol and rinsed in deionized water.

After the V grooves are formed in the silicon wafer to define the plurality of cell elements, the structure is placed in an ion implantation chamber and rotated 33° from the normal in one direction and N type dopant ions are directed towards the exposed silicon surface to form the N+ regions 60 and 62. Thereafter, the wafer is rotated 33° from normal in the opposite direction and exposed to P type ions to implant the P+ regions 64 and 66. The rotational alignment of the wafer prevents the particular dopants from implanting in the regions of desired opposite conductivity, and the oxide strips 74 and 76 provide a mask preventing the ions from entering the underlying silicon surface. Dual energy implants are preferably used to form the junction at a desired depth and with high surface concentration. In accordance with conventional ion implantation techniques, phosphorous ions are implanted at an energy of 150 keV for the N+ regions, and boron ions are implanted at an energy of 60 keV for the P+ regions, to give an 0.4 micron junction depth in each region. For the low energy implant 40 keV is used for phosphorous and 20 keV is used for boron to provide a high surface concentration of the dopants. Doses of $5 \times 10^{15}$ atoms per square centimeter and $10^{14}$ atoms per square centimeter are used for the high and low energy implants, respectively. The ion implantation is followed by an annealing step to minimize residual crystal lattice disorder and to obtain better quality junctions.

As shown in FIG. 6, the cell is completed by depositing metal interconnection 68 and reflective coatings 78 and 80 on the silicon elements. The metallization may comprise aluminum which is evaporated to a thickness of approximately 1 micron. Shorting around the ends of the diodes is prevented by using a metal shadow mask during evaporation which covers the end portions of the elements. Importantly, because the oxide strips 74 and 76 are undercut several microns during the preferential etching step, the metallization is discontinuous over the edges of these strips. Thus, while the aluminum metallization interconnects adjacent diode elements in series, the N+ and P+ regions of individual elements are not shorted. Consequently, no photomasking and etching step is required to remove unwanted metal.

In one embodiment, a two inch diameter silicon wafer was processed. Four cells, one in each quadrant of the wafer, were made using the processes outlined above. Each cell measure 0.49 centimeter on the side, 0.24 centimeter$^2$ in total area, and contained 43 individual diode elements. The four cells were separated by conventional scribe and break techniques. Flexible electrical leads were then connected, and the cell was mounted in a module.

FIG. 7 is a perspective view of another embodiment of a silicon cell shown partially in cross section which is very similar to the embodiment illustrated in FIG. 3. Like elements have the same reference numerals. In this embodiment the N+ regions 60 and 62 are extended across the bonded surfaces of elements 50 and 52, respectively, as shown at 60' and 62'. Alternatively, the P+ regions 64 and 66 could be so extended. In either embodiment, the N+ region and the P+ region of each element are not in contact. Thus, each element is provided with a PN junction, defined by the N+ region and the P type bulk silicon material, which provides for a low surface recombination of holes and electrons. Accordingly, there is no need for a silicon oxide layer at the radiation receiving surface of the cell. This embodiment is fabricated in a process similar to that described with reference to FIGS. 4–6 except oxide layer 58 is removed and the regions 60' and 62' are formed by ion implantation of an N type dopant such as phosphorous or arsenic into the surface prior to attachment of the silicon wafer to the plate 54 and V-groove etching of the silicon wafer.

FIG. 8 is another embodiment of a photovoltaic cell in accordance with the invention which is similar to the embodiment of FIG. 3, and again like elements have the same reference numerals. However, in this embodiment the N+ regions 60" and 62" and the P+ regions 64" and 66" are formed in the surface of each element 50 and 52, respectively, which is opposite to the surface bonded to glass plate 54. Silicon oxide is provided under the metal interconnect 68. The cell is particularly effective at trapping light, thus allowing the cell to be made quite thin and attain a high collection efficiency and high open circuit voltage. However, the process in manufacturing the device is somewhat more complicated as additional masking steps are required in defining the regions 60″, 62″, 64″ and 66″. In fabricating these regions photoresist masking techniques must be employed to define ion implantation or diffusion windows for the two N+ regions and for the P+ regions and the N+ and P+ regions must be formed prior to the etching step. Further masking and etching steps are required in providing contact openings and in defining the metallic interconnection pattern to the N+ and P+ regions. Thus, a total of five masking steps are required in the fabrication.

FIGS. 9–12 are perspective views partially in section of portions of other embodiments of photovoltaic cells in accordance with the invention wherein the silicon elements 100 and 102 are supportably mounted on an underlying substrate 104. Referring to FIG. 9, the bottom surfaces of the elements are provided with a silicon oxide coating 106 on which a material such as polysilicon is deposited by the chemical decomposition of tricholorosilane. Other substrate material can be provided as a substrate using the FAB process described above. V grooves are etched in the silicon material using the preferential etch process described above with reference to FIGS. 4–6 with N+ region 108 and P+ region 110 formed by ion implantation, as above. Silicon oxide strips 107 are provided on the top surface which selectively mask the silicon wafer for subsequent preferential etching. Following the ion implantation step, a thin layer of metal 112 (e.g. 100 angstrom thickness) is deposited on oxide layer 107 and on the V groove surfaces to interconnect adjacent elements. Thereafter, an antireflective coating 114, such as tantalum oxide, is deposited on the metal interconnect layer 112 and on metal layer 113 to complete the cell. In an alternative embodiment, the antireflective coating and thin metal can be replaced by a layer of indium-tin oxide.

FIG. 10 is an embodiment similar to the configuration of FIG. 9 and in which the N+ and P+ regions are formed in the surface of each element opposite to the surface abutting the substrate. In this respect, the embodiment is similar to the embodiment described with reference to FIG. 8. As in the embodiment of FIG. 8 the N+ and P+ regions 120 and 122 are formed in the silicon wafer by ion implantation or by diffusion of dopants prior to the preferential etch of the silicon wafer. However, unlike the embodiment of FIG. 8, impinging light from the concentrator first strikes the surface in which regions 120 and 122 are formed, and to improve the receptivity of the silicon to the impinging photons the surface 123 between regions 120 and 122 can be given a textured surface by applying the preferential etchant thereto for a limited period of time. By so doing, a plurality of pyramidal shapes are formed on the surface which are defined by the 1-1-1 crystal orientation planes. The metal interconnection 112 is applied over silicon oxide in the V grooves.

In the embodiment illustrated in FIG. 11 the N+ region 124 and the P+ region 126 of each element is defined in a surface of the silicon wafer by ion implantation or by diffusion techniques prior to the application of substrate 104 thereto. Importantly, it should be noted that the P+ region 126 of one element abuts the N+ region 124 of an adjacent element thus creating a tunnelling junction which provides serial electrical connection between adjacent elements. The V grooved surfaces of the elements are provided with a layer of silicon oxide and a layer of anti-reflective coating material shown generally at 128. Since the elements are serially interconnected by the tunnelling junction, a metallic interconnection pattern is not required on the element.

The embodiment illustrated in FIG. 12 is similar to the embodiment of FIG. 11. However, N+ and P+ regions of adjacent elements do not abut as in FIG. 11. In this embodiment a metallic interconnection pattern 130 is deposited over silicon oxide on the silicon wafer surface to interconnect the N+ region 124 of one element to the P+ region 126 of the adjacent element prior to the formation of substrate 104 thereon. Again, layers of silicon oxide and an antireflective coating shown generally at 128 are provided over the V grooved surfaces of the elements as in FIG. 11.

Solar cells in accordance with the present invention realize conversion efficiencies of 20% and higher. Because of the V groove configuration the elements can have a small geometry while still achieving a high rate of photon capture. The silicon cells are easily fabricated using conventional semiconductor processing techniques and in at least one embodiment a single mask fabrication procedure is employed. The very low series resistance of the elements permits efficient operation of the solar cell in sunlight concentrated 1,000 times or more. Further, the module provides efficient transfer of heat from the solar cell thus permitting an improved solar electric power system using high solar concentration.

As used herein, the term silicon oxide includes silicon dioxide, as conventionally used in semiconductor processing. Diffusion of dopants may include dopant ion implantation. Further, while the preferred embodiment utilizes silicon as the semiconductor material, other semiconductor material might be used in practicing the invention. Thus, while the invention has been described with reference to specific embodiments, the description is for illustrative purposes only and is not to be construed as limiting the invention. Various modifications, changes, and applications may occur to those skilled in the art without departing from the true spirit and scope of the invention as defined by the appended claims.

What is claimed is:

1. A solar electric power system comprising support means,
   concentrator means cooperatively mounted with said support means for receiving and concentrating solar radiation, a photovoltaic cell module mounted on said support means to receive said concentrated solar radiation,
   said module including a heat conductive housing having an open end,
   a photovoltaic semiconductor cell mounted across said open end in abutment with a heat transfer block, said semiconductor cell including a V grooved surface and said heat transfer block having a mating V grooved surface for receiving said semiconductor cell, metallic sponge and wick means attached to said heat transfer block and depending therefrom and into said housing, and liquid means within said housing for facilitating heat transfer.

2. A solar electric power system as defined by claim 1 wherein said heat transfer block comprises silicon material.

3. A solar electric power system as defined by claim 1 wherein said photovoltaic semiconductor cell comprises a plurality of single crystal semiconductor elements of one conductivity type with PN junctions defined therein, each element having a generally trapezoidal cross section, a top surface of each of said elements being bonded to a glass cover with said V shaped grooves being inverted.

4. A solar electric power system as defined by claim 3 wherein said semiconductor elements are bonded to said glass cover by means of an anti-reflective material and a layer of silicon oxide.

5. A solar electric power system as defined by claim 3 wherein each of said semiconductor elements has a bulk conductivity of a first type, a first region of doped semiconductor material of said first conductivity type in a first grooved surface region of said element, and a second region of doped semiconductor material of opposite conductivity type in a second grooved surface region of said element.

6. A solar electric power system as defined by claim 1 wherein said concentrator means includes an optic lens.

7. A solar electric power system as defined by claim 6 wherein said supporting means is movable about at least one axis.

8. For use in a solar electric power system, a photovoltaic cell module comprising a heat conductive housing having an open end, a photovoltaic semiconductive cell mounted across said open end in abutment with a heat transfer block, said semiconductor cell having a V grooved surface and said heat transfer block having a mating V grooved surface for receiving said semiconductor cell, metallic sponge and wick means attached to said heat transfer block and depending herefrom and into said housing, and liquid means within said housing for facilitating heat transfer.

9. A photovoltaic cell module as defined by claim 8 wherein said block comprises silicon material.

10. A photovoltaic cell module as defined by claim 8 wherein said photovoltaic semiconductor cell comprises a plurality of single crystal semiconductor elements of one conductivity type, each element having a generally trapezoidal cross section, a glass plate, means attaching one side of each element to said glass plate whereby each element can receive solar radiation through said glass plate, a first region of doped semiconductor material of said one conductivity type formed in a first surface region of said element, and a second region of doped semiconductor material of opposite conductivity type formed in a second surface region of said element, and means electrically interconnecting said semiconductor elements.

11. A photovoltaic cell module as defined by claim 10 wherein said semiconductor elements are bonded to said glass plate by means of an antireflective material and a layer of silicon oxide.

12. A photovoltaic cell module as defined by claim 10 wherein each of said elements has a bulk conductivity of a first type, a first region of doped semiconductive material of said first conductivity type in a first grooved surface region, a second region of doped semiconductive material of opposite conductivity type in a second grooved surface region.

13. A photovoltaic cell having a grooved surface adapted to mate with a grooved surface of a heat transfer block comprising a plurality of single crystal semiconductor elements of one conductivity type, each element having a generally trapezoidal cross section which defines said grooved surface, a supporting glass plate, means attaching the base of each said trapezoidal element to said glass plate whereby each element can receive solar radiation through said glass plate, a layer of reflective material on a second side of each element which is opposite to said one side attached to said glass plate, a first region of doped semiconductive material of said one conductivity type formed in a first surface region of each said element, and a second region of doped semiconductive material of opposite conductivity type formed in a second surface region of each said element, and means electrically interconnecting said semiconductor elements.

14. A photovoltaic cell as defined in claim 13 wherein said means for attaching said semiconductor elements to said glass plate comprises a layer of antireflective material and a layer of silicon oxide.

15. A photovoltaic cell as defined by claim 13 wherein said elements are defined by a plurality of grooves formed in a semiconductor body and wherein said first surface region of each cell lies along a first grooved surface of said cell and said second surface region of each cell lies along a second grooved surface of said cell.

16. A photovoltaic cell as defined by claim 15 wherein said means for electrically interconnecting said elements comprises a layer of metal formed on grooved surfaces of adjacent elements.

17. A photovoltaic cell as defined by claim 16 wherein said means for electrically interconnecting said elements comprises a reflective material.

18. A photovoltaic cell as defined by claim 15 wherein said second surface region additionally lies along said surface of said cell which is attached to said glass plate.

19. A photovoltaic cell as defined by claim 18 wherein said means for electrically interconnecting said elements comprises a layer of metal formed on grooved surfaces of adjacent elements.

20. A photovoltaic cell as defined by claim 19 wherein said means for electrically interconnecting said elements comprises a reflective material.

21. A photovoltaic cell as defined by claim 13 wherein said first surface region and said second surface region lie in a surface of each element which is opposite to said side of each element which is attached to said glass plate.

22. A photovoltaic cell as defined by claim 13 wherein said one conductivity type is N type and said opposite conductivity type is P type.

23. A photovoltaic cell as defined by claim 22 wherein each of said elements has a dopant concentration of approximately $10^{14}$ atoms per cubic centimeter and said first and second surface regions have a surface dopant concentration on the order of $10^{19}$–$10^{20}$ atoms per cubic centimeter.

24. A photovoltaic cell as defined by claim 13 and further including a layer of optically transparent and electrically insulating material on said second side of each element with said layer of reflective material on said layer of optically transparent and electrically insulating material.

25. A photovoltaic cell as defined by claim 24 wherein said layer of optically transparent and electrically insulating material extends beyond the edges of said second side of each element.

26. A photovoltaic cell as defined by claim 24 wherein said layer of optically transparent and electrically insulating material comprises silicon oxide.

27. A photovoltaic cell comprising a plurality of single crystal semiconductor elements of one conductivity type, each element having a generally trapezoidal cross section, a supporting substrate, means attaching one side of each element to said substrate, a first region of doped semiconductor material of said one conductivity type formed in a first surface region of each said element, a second region of doped semiconductor material of opposite conductivity type formed in a second surface region of said element, means electrically interconnecting said semiconductor elements, said first surface region and said second surface region lying in said surface of said element which is attached to said substrate.

28. A photovoltaic cell as defined in claim 27 wherein doped regions of adjacent elements are in physical contact thereby providing electrical interconnection between elements.

29. A photovoltaic cell as defined by claim 27 wherein said means for electrically interconnecting cells comprises a layer of metal.

* * * * *